United States Patent
Cheng et al.

(10) Patent No.: US 10,249,755 B1
(45) Date of Patent: Apr. 2, 2019

(54) TRANSISTOR WITH ASYMMETRIC SOURCE/DRAIN OVERLAP

(71) Applicant: International Business Machines Corporation, Armonk, NY (US)

(72) Inventors: Kangguo Cheng, Schenectady, NY (US); Peng Xu, Santa Clara, CA (US); Heng Wu, Guilderland, NY (US); Zhenxing Bi, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/016,454

(22) Filed: Jun. 22, 2018

(51) Int. Cl.
| H01L 29/66 | (2006.01) |
| H01L 29/78 | (2006.01) |
| H01L 21/336 | (2006.01) |
| H01L 29/08 | (2006.01) |
| H01L 29/10 | (2006.01) |
| H01L 29/417 | (2006.01) |
| H01L 21/311 | (2006.01) |
| H01L 21/3105 | (2006.01) |
| H01L 21/306 | (2006.01) |
| H01L 21/02 | (2006.01) |

(52) U.S. Cl.
CPC ...... *H01L 29/7835* (2013.01); *H01L 29/0847* (2013.01); *H01L 29/1037* (2013.01); *H01L 29/41791* (2013.01); *H01L 29/6656* (2013.01); *H01L 29/66545* (2013.01); *H01L 29/66636* (2013.01); *H01L 29/66659* (2013.01); *H01L 29/66795* (2013.01); *H01L 29/7851* (2013.01); *H01L 21/0217* (2013.01); *H01L 21/30604* (2013.01); *H01L 21/31053* (2013.01); *H01L 21/31111* (2013.01); *H01L 21/31116* (2013.01)

(58) Field of Classification Search
CPC .......... H01L 29/7835; H01L 21/31111; H01L 21/31053; H01L 29/0847; H01L 29/1037; H01L 29/7851; H01L 29/41791; H01L 29/66659; H01L 29/66795; H01L 29/66636; H01L 21/30604; H01L 21/0217; H01L 21/31116
See application file for complete search history.

(56) References Cited

U.S. PATENT DOCUMENTS

| 4,962,054 A | 10/1990 | Shikata |
| 6,121,093 A | 9/2000 | Cheng et al. |

(Continued)

FOREIGN PATENT DOCUMENTS

| CN | 104779292 | 7/2015 |
| KR | 10-1682420 | 12/2016 |
| WO | WO 2013075690 | 5/2013 |

OTHER PUBLICATIONS

Goel, Ashish et al., Asymmetric Drain Spacer Extension (ADSE) FinFETs for Low-Power and Robust SRAMs, IEEE Transactions on Electron Devices, vol. 58, No. 2, pp. 296-308, Feb. 2011.

(Continued)

*Primary Examiner* — Savitr Mulpuri
(74) *Attorney, Agent, or Firm* — Vazken Alexanian; Otterstedt, Ellenbogen & Kammer, LLP

(57) ABSTRACT

An asymmetric field-effect transistor having different gate-to-source and gate-to-drain overlaps allows lower parasitic capacitance on the drain side of the device and lower resistance on the source side. Source and drain regions having different configurations can be formed simultaneously using the same precursor materials.

4 Claims, 6 Drawing Sheets

(56) References Cited

U.S. PATENT DOCUMENTS

| | | | |
|---|---|---|---|
| 6,610,576 | B2 | 8/2003 | Nowak |
| 7,585,735 | B2 | 9/2009 | Mathew et al. |
| 7,768,006 | B2 | 8/2010 | Zhu et al. |
| 8,138,030 | B2 | 3/2012 | Chang et al. |
| 8,158,482 | B2 | 4/2012 | Hoentschel et al. |
| 8,574,991 | B2 | 11/2013 | Hoentschel et al. |
| 8,796,735 | B2 | 8/2014 | Lauer et al. |
| 8,969,160 | B2 | 3/2015 | Piao et al. |
| 9,040,960 | B2 | 5/2015 | Chen et al. |
| 9,142,660 | B2 | 9/2015 | Guo et al. |
| 9,362,383 | B1 | 6/2016 | Balakrishnan et al. |
| 9,391,204 | B1 | 7/2016 | Cheng et al. |
| 9,508,597 | B1 | 11/2016 | Liu et al. |
| 9,543,435 | B1 | 1/2017 | Basker et al. |
| 9,634,138 | B1 | 4/2017 | Choi et al. |
| 9,659,942 | B1 | 5/2017 | Basker et al. |
| 9,837,403 | B1 | 12/2017 | Bi et al. |
| 9,905,647 | B2 | 2/2018 | Fay et al. |
| 2002/0034854 | A1 | 3/2002 | Lu et al. |
| 2012/0168832 | A1 | 7/2012 | Anderson et al. |
| 2016/0056278 | A1 | 2/2016 | Avci et al. |
| 2017/0084726 | A1 | 3/2017 | Balakrishnan et al. |

OTHER PUBLICATIONS

Kangguo Cheng , unpublished U.S. Appl. No. 16/016,477 Tunnel Transistor, filed Jun. 22, 2018, pp. 1-29 plus 6 sheets drawings.

Zhenxing Bi, unpublished U.S. Appl. No. 15/808,869 Transistor With Asymmetric Spacers, filed Nov. 9, 2017, pp. 1-29 plus 6 sheets drawings.

Machine translation of KR 10-1682420.

IBM, Tunnel FET with Intermediate Tunneling Layer (TFITL),IP.com, No. IPCOM000187376D, Sep. 3, 2009.

Wang, Wei et al., Design of U-Shape Channel Tunnel FETs With SiGe Source Regions, IEEE Transactions on Electronic Devices, vol. 61, No. 1, Jan. 2014.

English translation of abstract of CN 104779292.

Paul J. Otterstedt, List of IBM Patents or Patent Applications Treated as Related , Oct. 5, 2018, 2 Pages.

Zhenxing Bi, unpublished U.S. Appl. No. 16/159,673 Transistor With Asymmetric Spacers, filed Oct. 14, 2018, pp. 1-28 plus 6 sheets drawings.

Paul J. Otterstedt, List of IBM Patents or Patent Applications Treated as Related, Oct. 24, 2018, pp. 1-2.

US 10,249,755 B1

TRANSISTOR WITH ASYMMETRIC SOURCE/DRAIN OVERLAP

BACKGROUND

The present invention relates generally to the electronic arts and, more particularly, to field-effect transistors and their fabrication.

There is a trade-off between source/drain series resistance and gate to source/drain capacitance in the design of metal oxide semiconductor field-effect transistors (MOSFETs). Specifically, FET saturated currents are more sensitive to source resistance and less sensitive to drain resistance. FET drive current improves more with reduced source resistance than with reduced drain resistance. Additionally, circuit delay is more sensitive to gate to drain capacitance than gate to source capacitance. That is, due to the Miller effect, the gate to drain capacitance can impact circuit delay significantly more than gate to source capacitance. However, some techniques associated with reducing source/drain resistance to improve drive current often simultaneously increase the gate to drain capacitance, thereby increasing circuit delay. Similarly, some techniques associated with reducing gate to source/drain capacitance often simultaneously increase source resistance, thereby degrading drive current. Thus, there is often an intrinsic trade-off between decreasing source resistance to improve drive current and decreasing gate to drain capacitance to minimize circuit delay.

BRIEF SUMMARY

Asymmetric field-effect transistor structures and techniques for fabricating such structures are disclosed.

In one aspect, an exemplary asymmetric field-effect transistor device includes a semiconductor substrate including a first region, a second region, and a channel region between the first and second regions. The first region including a recess extending vertically therein. The second region does not include a recess. A gate electrode including a drain side and a source side is operatively associated with the channel region. A gate dielectric layer is between the gate electrode and the channel region. A doped epitaxial source region is on the first region of the semiconductor substrate and extends within the recess. A doped epitaxial drain region is on the second region of the semiconductor substrate.

In another aspect, an exemplary method includes obtaining a structure including a semiconductor substrate having a first portion including a recess extending vertically therein, a second portion lacking a recess, and a channel region between the first and second portions. An embedded source region is epitaxially grown within the recess in the first portion of the semiconductor substrate and a cladded drain region is epitaxially grown on the second portion of the semiconductor substrate. A gate dielectric layer is deposited over the channel region of the semiconductor substrate and a metal gate is formed on the gate dielectric layer.

A further method of fabricating an asymmetric field-effect transistor device includes obtaining a structure including a semiconductor substrate, sacrificial mandrels on the semiconductor substrate, dummy gates on sidewalls of the sacrificial mandrels, and a vertical trench between a pair of the dummy gates. The vertical trench is filled with a filling material having a different composition from the mandrels and dummy gates. The mandrels are selectively removed to expose first portions of the semiconductor substrate. The first portions of the semiconductor substrate are subjected to a first etching process, thereby forming first recesses within the first portions of the semiconductor substrate. The filling material is removed from the vertical trench to expose a second portion of the semiconductor substrate. The first and second portions of the semiconductor substrate are subjected to a second etching process, thereby enlarging the first recesses within the first portions of the semiconductor substrate and forming a second recess in the second portion of the semiconductor substrate, the first recesses extending further vertically within the semiconductor substrate than the second recess following the second etching process. Embedded source and drain regions are epitaxially grown within the first and second recesses in the semiconductor substrate. The dummy gates are removed and replaced with a gate dielectric layer and metal gate material on the gate dielectric layer.

Techniques and devices as disclosed herein can provide substantial beneficial technical effects. By way of example only and without limitation, one or more embodiments may provide one or more of the following advantages:

Precise overlay of source/drain patterning mask over a small gate not required;

Self-aligned sidewall image transfer (SIT) process enables asymmetry;

Greater gate-to-source junction overlap and smaller gate-to-drain junction overlap;

Different source/drain epitaxial configurations can be grown simultaneously;

Different fin pitches not required for fabrication of asymmetric transistors;

Lower resistance on the source side and lower parasitic capacitance on the drain side.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of an illustrative asymmetric field-effect transistor fabricated on a silicon substrate. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

The figures schematically illustrate an exemplary sequence of fabrication steps that may be employed in obtaining an asymmetric field-effect transistor. Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

Figure 1:
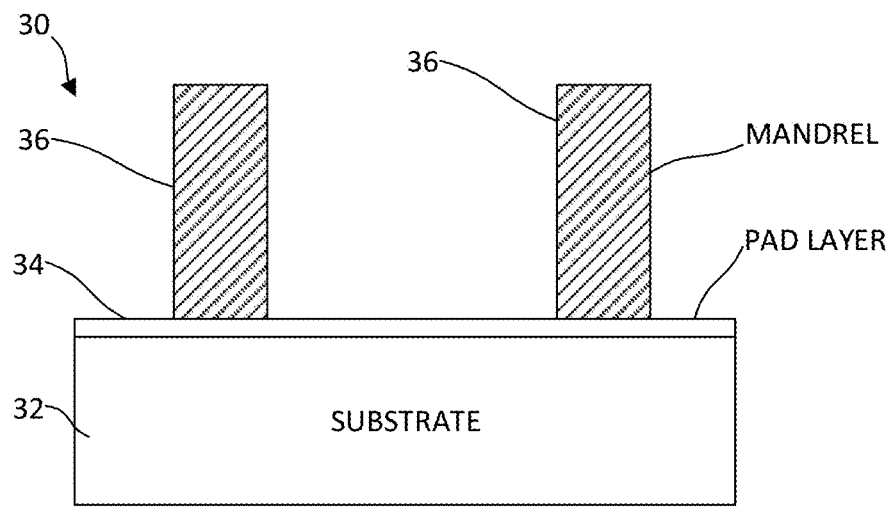
FIG. 1 is a schematic, cross-sectional view depicting a finned semiconductor substrate having mandrels formed thereon.

With reference now to the structure 30 shown in FIG. 1, a bulk silicon wafer 32 is employed as the substrate in some embodiments. The substrate consists essentially of monocrystalline silicon in one or more embodiments. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While some exemplary embodiments relate to structures including doped or undoped (100) silicon as a substrate material, it will be appreciated that the principles expressed are applicable to other semiconductor substrates and substrates with crystallographic orientations other than (100). For example, substrates such as semiconductor-on-insulator (SOI) substrates as well as bulk substrates can be employed in accordance with the teachings herein.

Referring again to FIG. 1, a pad layer 34 such as a pad oxide or pad nitride layer is formed on the substrate. As known in the art, a thin silicon oxide or silicon nitride layer can be grown on a silicon wafer as a protective layer to facilitate downstream processes. Electrically isolated active regions are then formed from the substrate by techniques such as shallow trench isolation (STI). Each active region can comprise planar semiconductor structures, fin structures, nanowires, nanosheets, or any other suitable semiconductor materials.

Vertical mandrels 36 are formed on the substrate. The sacrificial mandrels may comprise, for example, amorphous silicon (a-Si) or polycrystalline silicon (polysilicon). The sacrificial material comprising the mandrels may be deposited by a deposition process such as, but not limited to, physical vapor deposition (PVD), chemical vapor deposition (CVD), plasma enhanced chemical vapor deposition (PECVD), inductively coupled plasma chemical vapor deposition (ICP CVD), atomic layer deposition (ALD), or any combination thereof. Hydrogenated amorphous silicon is typically deposited by plasma-enhanced chemical vapor deposition (PECVD) although other techniques such as hot-wire chemical vapor deposition (HWCVD) may be used. A layer of such sacrificial material is patterned to obtain discrete mandrels having substantially vertical side walls. A patterned mask (not shown) including openings corresponding to the mandrel locations may be formed on the layer of sacrificial material. The sacrificial material is then subjected to a reactive ion etch to remove the sacrificial material between the mandrels 36 down to the pad layer 34, which functions as an etch stop. The mandrels 36 may or may not have the same width. In some embodiments, mandrel width is in the range of ten to fifty nanometers (10-50 nm) and mandrel height is fifty to one hundred fifty nanometers (50-150 nm). Mandrel dimensions are exemplary and not limiting.

Figure 2:
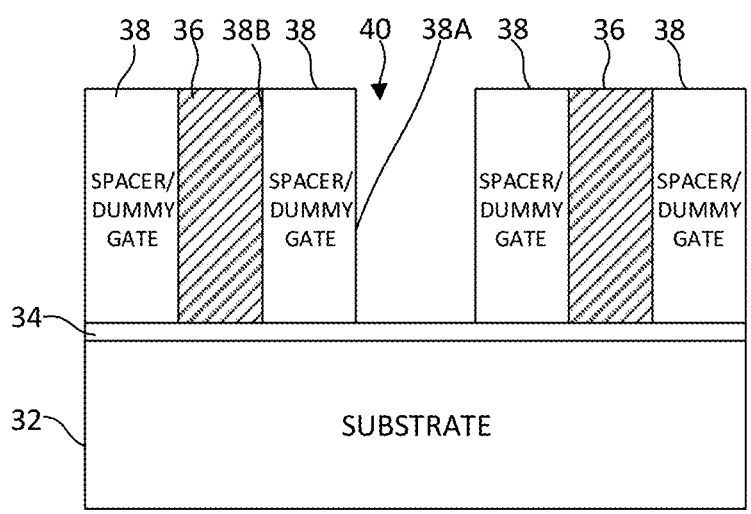
FIG. 2 is a cross-sectional view showing the structure of FIG. 1 following formation of dummy gate spacers on the mandrels.

Referring to FIG. 2, spacers/dummy gates 38 are formed on the mandrel sidewalls. Silicon nitride spacers/dummy gates are formed in some embodiments. A silicon nitride layer can be deposited via CVD, PECVD, sputtering, or other suitable technique to form the spacers. Amorphous carbon spacers/dummy gates are formed on the mandrel sidewalls in other embodiments using chemical vapor deposition (CVD) or other suitable process. The material chosen for spacer/dummy gate formation should be compatible with subsequent processing steps as described below. Spacer/dummy gate thickness is between ten and fifty nanometers (10-50 nm) in some embodiments. The spacers can be formed by any method known in the art, including depositing a conformal layer over the substrate and mandrels 36 and removing unwanted material using an anisotropic etching process such as reactive ion etching or plasma etching. The resulting structure includes trenches 40 between each set of mandrels and adjoining spacers/dummy gates and extending down to the pad layer 34. The trenches 40 may or may not have equal widths. Trench width can be in the range of ten to fifty (10-50 nm) in the exemplary embodiments.

Figure 3:
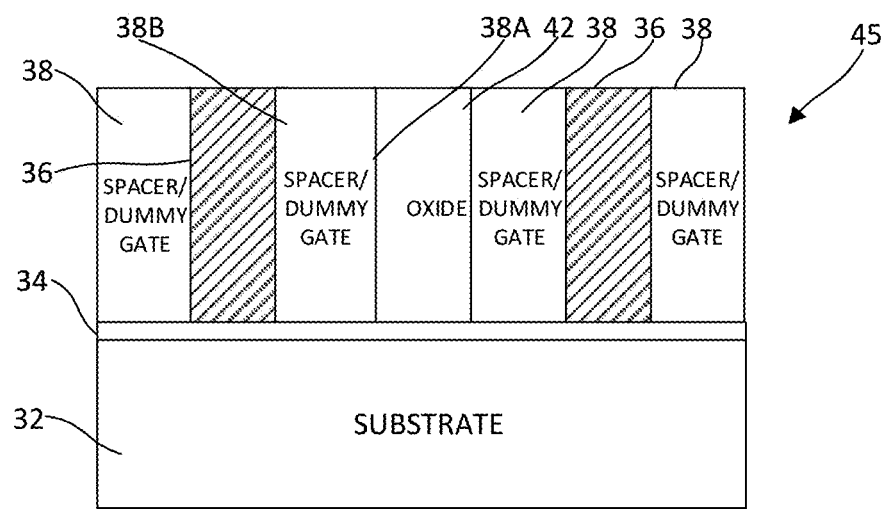
FIG. 3 is a schematic, cross-sectional view showing the structure of FIG. 2 following deposition of fill material between the spacers.

A filler material is deposited in the trenches 40 in obtaining a structure as schematically illustrated in FIG. 3. The filler material adjoins the drain sides 38A of the dummy gates while the mandrels 36 adjoin the source sides 38B thereof. The filler material is different in composition from the materials comprising the mandrels 36 and spacers/dummy gates 38, which allows for selective etching thereof. Non-limiting examples of materials for the filler layers 42 include amorphous carbon, silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The resulting structure is planarized, for example by chemical mechanical planarization (CMP), to obtain the structure shown in FIG. 3. The heights of the mandrels 36, spacers/dummy gates 38 and filler layers 42 comprising the structure are substantially the same. As discussed further below, the regions occupied by adjoining mandrels 36, spacers/dummy gates 38 and filler layers 42 can later be employed to form source, gate and drain regions of asymmetric field-effect transistors. The spacers/dummy gates 38 may accordingly be employed as dummy gates that are replaced by metal gate material during subsequent processing. The dummy gates have source sides and drain sides.

Figure 4:
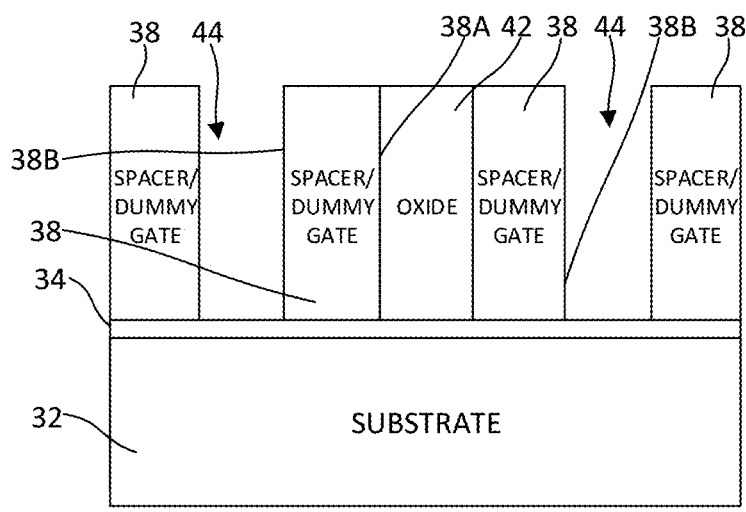
FIG. 4 is a schematic, cross-sectional view thereof following removal of the mandrels from the structure shown in FIG. 3.

The mandrels 36 are removed to form a structure as shown in FIG. 4. In embodiments including amorphous silicon mandrels, a wet etch using hot ammonia can be employed to selectively remove the mandrels while leaving the spacers/dummy gates 38 and the oxide layers 42, 34 substantially intact. Trenches 44 are accordingly formed between selected pairs of spacers/dummy gates 38.

The pad oxide layer is removed from the bottoms of the trenches 44 using, for example, a wet etching process including a hydrofluoric (HF) acid mixture. The substrate 32 is then subjected to a wet etching process to further extend the trenches 44 vertically and laterally in the portions of the substrate to be employed for growing source regions. The lateral undercut is optional. In embodiments where lateral undercutting is deemed unnecessary, a vertical recess can be formed by a directional etch such as reactive ion etch (ME) process. If both vertical and lateral etching are desired, either a single isotropic etch, or a combination of anisotropic etch and isotropic etch can be used. The adjoining dummy gates 38 and remaining portions of the pad oxide layer function as an etch mask during etching of the substrate. Recesses 44' within the semiconductor substrate can be formed using an anisotropic etching (e.g., reactive ion etch (ME)), an isotropic etch (e.g., chemical downstream etch) or a combination of both isotropic and anisotropic etching. The recesses can be bowl shaped, sigma shaped, or other shape configuration as a result of the chosen recess process(es). A wet etch containing ammonia ($NH_4OH$) may, for example, be employed for the isotropic etching of silicon. Alternatively, a RIE process can be used to vertically recess Si fins. Optionally, this process is timed so that the substrate is laterally etched by about 3-10 nm beneath the dummy gates, so that the edges of the recesses 44' after the pullback are located under the dummy gates 38 and the portions of the pad oxide layer 34 beneath the dummy gates. The depths of the recesses 44' may be between twenty and sixty nanometers (20-60 nm).

Figure 6A:
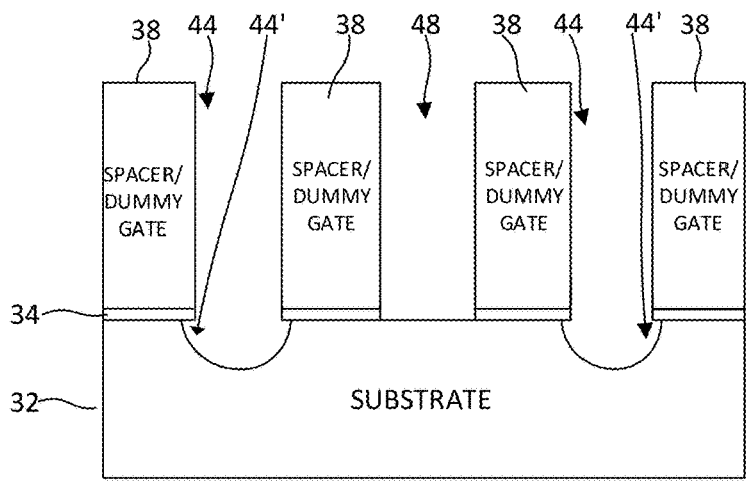
FIG. 6A is a schematic, cross-sectional view thereof following removal of the fill material between dummy gate spacers.

The filler layers 42 between the drain sides 38A of the spacers/dummy gates 38 are removed to form additional trenches 48 extending down to the portions of the substrate 32 used for growing drain regions, as shown in FIG. 6A. A selective etch may be employed to remove the filler material, leaving the spacers/dummy gates 38 substantially intact. In one embodiment, the filler layer 42 comprises amorphous carbon that can be selectively etched, for example, by ozone gas etching, or by oxygen plasma etching. Alternatively, amorphous carbon can be selectively etched by wet etch containing sulfuric acid and peroxide. If the filler layer 42 is oxide, it and the underlying portions of the pad oxide layer 34 can, for example, be selectively etched using $CHF_3$/Ar plasma or a wet etch containing hydrofluoric acid.

Figure 5:
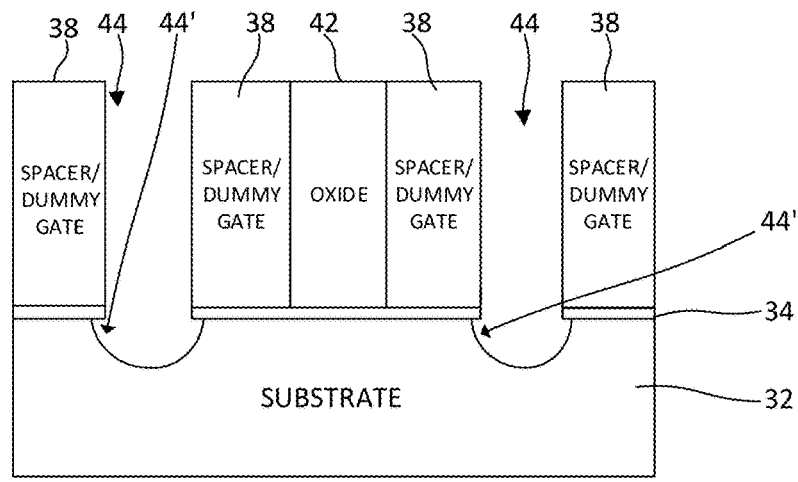
FIG. 5 is a schematic, cross-sectional view of the structure of FIG. 4 following etching of the finned substrate to form lateral undercuts in the source regions of the substrate.
Figure 6B:
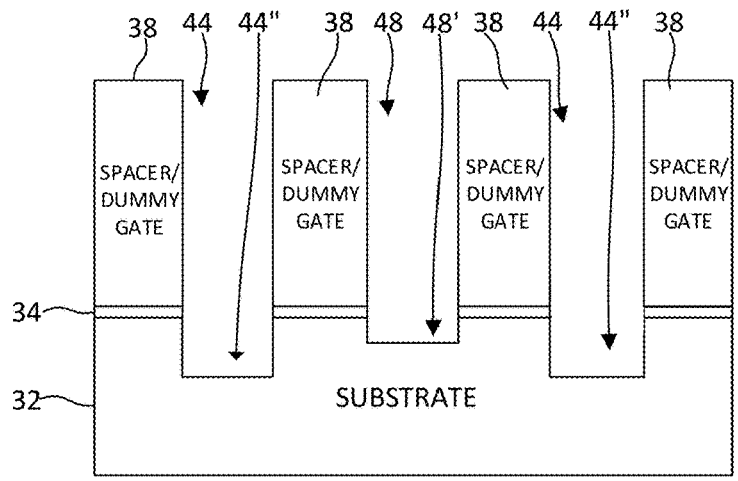
FIG. 6B is a schematic, cross-sectional view of an alternative embodiment following formation of recesses in the substrate on both the source and drain sides of the dummy gate spacers.
Figure 7A:
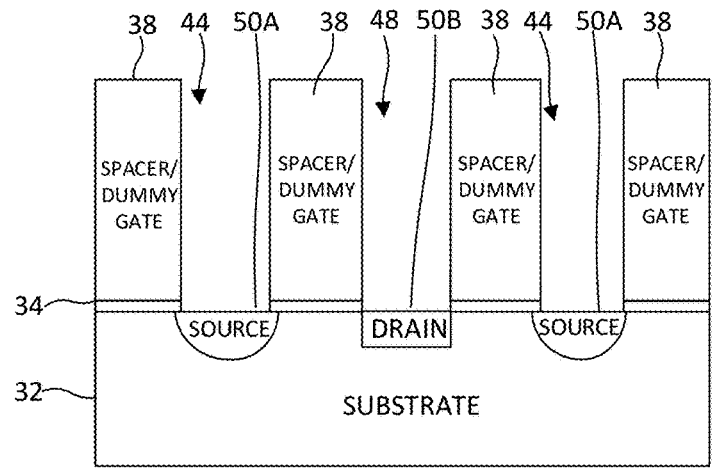
FIG. 7A is a schematic, cross-sectional view of the structure shown in FIG. 6A following formation of source/drain regions between dummy gates.

Referring to FIG. 7A, source and drain regions 50A, 50B are formed on the substrate. The drain regions are aligned with the trenches 48 formerly containing the fill layers 42. The source regions are aligned with the trenches 44 formerly containing the mandrels and fill the laterally enlarged recesses 44' within the substrate. Optionally, the substrate 32 is also recessed following removal of the fill layers 42 to form recesses 48' in the substrate before drain epitaxy, as shown in FIG. 6B. Epitaxial structures are then grown inside both sets of recesses. In embodiments in which both source and drain substrate areas are recessed, after a first recess of the source areas such as shown in FIG. 5 or instead using only a directional etch, both the drain and source areas will be recessed following removal of the fill layer 42 over the drain area. This procedure resulting in greater etching of the source sides than the drain sides of the dummy gates 38 because drain sides of the substrate have been recessed only once and source sides have been recessed twice. As shown in FIG. 6B, the source side recesses 44" are deeper than the drain-side recess 48'. In the exemplary embodiment shown in FIG. 7A, the drain side is not recessed; the drain side has cladding epitaxy 50B on fin sidewalls, and the source side has embedded epitaxy 50A (epitaxy in the recessed region 44'). In other words, the drain epitaxy 50B is directly grown on the exposed surface of the semiconductor substrate in the drain region and there is no recessing of the substrate under the trenches 48. Epitaxial growth within substrate recesses, as conducted during the epitaxial growth of the source regions, may be characterized as "embedded epitaxy." Epitaxial growth of drain regions on substrate fins that have not been recessed is characterized as "cladding epitaxy." FIG. 7A shows the optional case including recesses 44' only in the source regions, resulting in embedded epitaxy on the source side 38B of each dummy gate and cladding epitaxy on the drain side 38A thereof.

The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. The dopants may be incorporated in situ using appropriate precursors, as known in the art. By "in situ" it is meant that the dopant that dictates the conductivity type of a doped layer is introduced during the process step, e.g., epitaxial deposition that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). Such growth results in faceted structures that, in some cases, merge into a continuous volume and in other cases remain isolated. Source and drain growth can be effected simultaneously and provide source and drain regions comprising the same epitaxial materials but having different configurations. In some embodiments, a portion or all dopants can be incorporated in source/drain regions by other suitable doping technique, including but not limited to, ion implantation, gas phase doping, plasma doping, plasma immersion, ion implantation, cluster doping, infusion doping, liquid phase doping, solid phase doping, or any suitable combination of those doping techniques.

Figure 8:
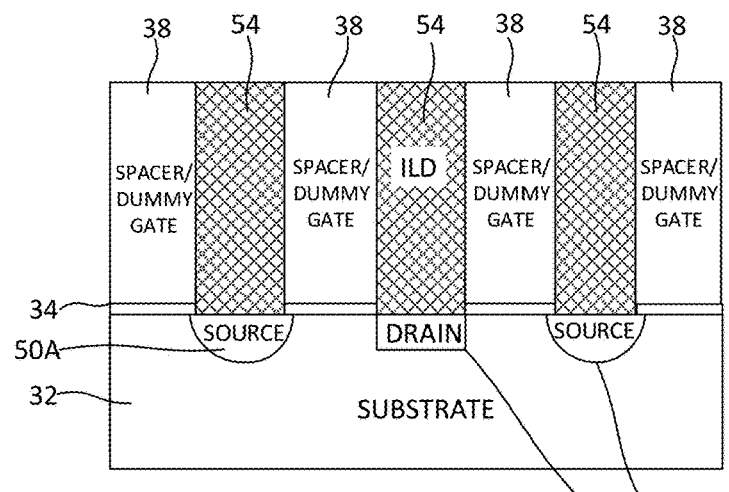
FIG. 8 is a schematic, cross-sectional view of the structure shown in FIG. 8 following deposition of an interlevel dielectric (ILD) layer and planarization.

Referring to FIG. 8, an interlevel dielectric (ILD) layer 54 is deposited on the structure and fills the trenches 44, 48 above the doped, epitaxial source and drain regions 50A, 50B. The ILD layer 54 may be formed from any suitable dielectric material, including but not limited to spin-on-glass, a flowable oxide, a high density plasma oxide, borophosphosilicate glass (BPSG), or any combination thereof. The ILD layer is deposited by any suitable deposition process including but not limited to CVD, PVD, plasma-enhanced CVD, atomic layer deposition (ALD), evaporation, chemical solution deposition, or like processes. In some embodiments, ILD layer 54 may comprise a single layer (e.g., oxide) or multiple layers (e.g., a silicon nitride liner followed by oxide fill). The ILD layer is planarized using chemical mechanical planarization (CMP), as known in the art, to obtain a structure as schematically illustrated in FIG. 8. The top surfaces of the spacers/dummy gates 38 are exposed following CMP.

The spacers/dummy gates 38 and the portions of the pad oxide layer 34 beneath the dummy gates are removed from the structure shown in FIG. 8 as part of a replacement metal gate (RMG) process. If the spacers/dummy gates 38 are amorphous carbon, they can be removed by using oxygen plasma or ozone etch. If the spacers/dummy gates are silicon nitride, they can be removed either using a wet etch (e.g., aqueous solution containing phosphoric acid) or dry etch (e.g., a plasma containing $SF_6/CH_4/N_2/O_2$ plasma). The sidewalls of the ILD layer 54 are also optionally trimmed to reduce the widths thereof following spacer/dummy gate removal.

Figure 9:
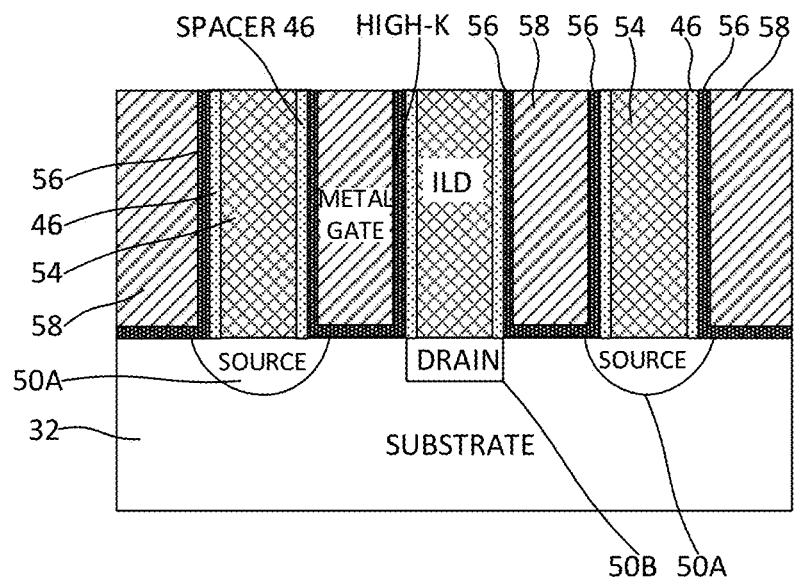
FIG. 9 is a schematic, cross-sectional view following removal of the dummy gates and formation of replacement metal gates in the structure shown in FIG. 8.

A set of dielectric sidewall spacers 46 is formed on the sidewalls of the columns of ILD material, as schematically illustrated in FIG. 9. It will be noted that the ILD columns have reduced widths in this exemplary embodiment, having been trimmed using a reactive ion etch or other suitable trimming process. The dielectric sidewall spacers 46 may consist essentially of, for example silicon oxide, silicon oxynitride, silicon nitride, SiBCN (siliconborocarbonitride) or SiOCN (siliconoxycarbonitride), SiOC (siliconoxycarbide). A conventional spacer formation process, namely, a conformal deposition process (e.g., ALD or CVD) followed by an anisotropic etch process (e.g., RIE) that acts to remove the just-deposited material from the horizontal surfaces, may be employed to form the sidewall spacers 46. Sidewall spacer thickness is between one and three nanometers (4-8 nm) in some embodiments. The thickness of the sidewall spacers 46 on each sidewall of the ILD columns 54 is substantially the same in some embodiments. The sidewall spacers 46 of the completed device will accordingly have the same thickness on both the source side and the drain side of the gate electrode in some embodiments.

A gate dielectric layer 56 forms portions of the gate stack that replace the spacers/dummy gates 38 for the asymmetric transistor devices to be fabricated. The gate dielectric layer 56 adjoins the sidewall spacers 46 and the channel regions within the semiconductor substrate and between the source and drain regions 50A, 50B. Non-limiting examples of suitable materials for the gate dielectric layer 56 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 56 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Figure 10A:
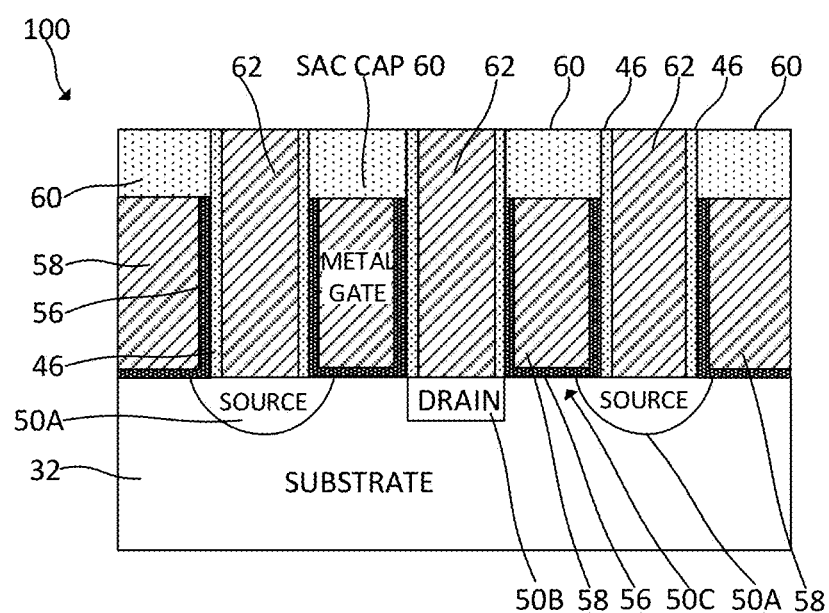
FIG. 10A is a schematic, cross-sectional view thereof taken along the plane of line A-A in FIG. 10.
Figure 10B:
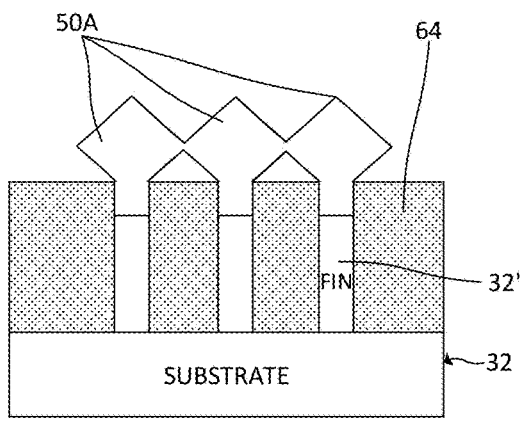
FIG. 10B is a schematic, cross-sectional view thereof taken along the plane of line S-S in FIG. 10.
Figure 10C:
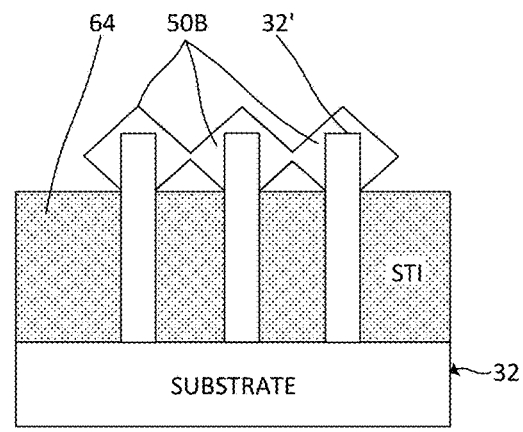
FIG. 10C is a schematic, cross-sectional view thereof taken along the plane of line D-D in FIG. 10.
Figure 10:
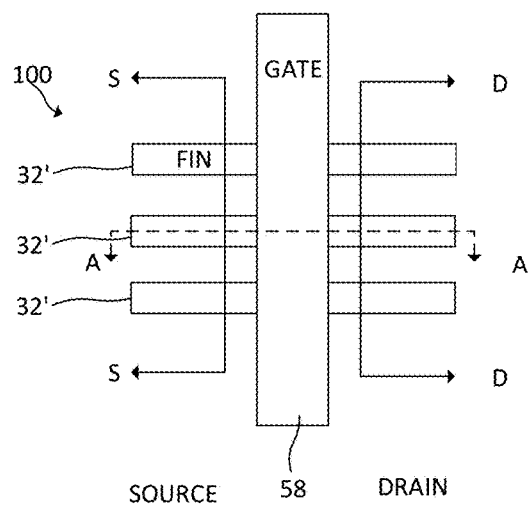
FIG. 10 is a top plan view of an asymmetric FinFET with embedded source epitaxy and cladding drain epitaxy.

Electrically conductive gate material is deposited in the regions formerly containing the spacers/dummy gates 38. The deposited metal gate material form the metal gates 58 of the asymmetric field-effect transistors, as shown in FIG. 10. The metal gates 58 include a source side and a drain side. The metal gates 58 overlap portions of the laterally enlarged source regions 50A in some embodiments. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, thermal or e-beam evaporation, or sputtering. A planarization process, for example, chemical mechanical planarization (CMP), is performed to polish the top surface of the deposited gate metal material. The asymmetry of the source and drain regions formed using the process described above results in less gate/junction overlap on the drain side of the device and greater gate/junction overlap on the source side of the device.

Source/drain junctions can be formed by trimming the ILD columns 54 so that portions of the source and drain regions will extend beneath the spacers and/or by dopant diffusion from the source/drain epitaxy (regions 50A, 50B) into the semiconductor substrate 32. Techniques such as rapid thermal anneal (RTA), flash anneal, laser anneal, or any suitable combination of those annealing techniques, may be employed to cause dopant diffusion and formation of source/drain junctions in embodiments wherein the ILD columns are not trimmed. The junctions extend laterally from the source and drain regions. Thermal annealing causes the diffusion of dopants from doped source/drain regions towards channel to form gate-to-source/drain overlapping. The dopant diffusion anneal can be performed immediately after source/drain formation (FIG. 7), or after high-k gate dielectric formation. In practice, a high thermal budget anneal after gate metal formation is typically avoided. In embodiments wherein the ILD columns are trimmed, both the source and drain regions 50A and 50B have portions directly beneath the bottom ends of the sidewall spacers 46. If the ILD columns are not trimmed, only the relatively wide (laterally extended) source regions will have portions directly beneath a pair of sidewall spacers 46 prior to dopant diffusion.

In some embodiments, the electrically conductive gates can include a work function metal (WFM) layer (not shown) disposed between the gate dielectric layer and another electrically conductive metal gate material. The WFM sets the transistor characteristics such as threshold voltage (Vt) to a predetermined value. In some embodiments, the WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, ALD, CVD, PECVD, PVD, plating, thermal or e-beam evaporation, and sputtering.

The gate metal and adjoining gate dielectric/WFM layer are recessed to form cavities between the spacers 46. A timed directional reactive ion etch may be employed to perform etch-back of the gate metal. A mask (not shown) may be applied and patterned prior to etching portions of the structure. The recesses above the gate metal are filled with a dielectric material to form dielectric caps 60 that can protect the metal gates during self-aligned contact (SAC) etch, as shown in FIG. 10A. The caps may be formed from materials such as silicon nitride to facilitate a self-aligned contact (SAC) process, ensuring requisite selectivity for the SAC etch. After deposition, the dielectric cap material is planarized to remove it from the surface of the structure. The dielectric cap material remains within the recesses above the gate metal following planarization. Dielectric caps prevent shorting between the metal gates and subsequently formed self-aligned contacts 62. As known in the art, self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material of the FinFETs. Self-aligned contacts 60 are accordingly formed within a replacement metal gate process while preventing gate to contact shorts.

The source/drain contacts 60 are formed any suitable patterning and metallization processes. For example, a mask can be used to open the areas where source/drain contacts are needed. The exposed ILD 54 is removed to form contact trenches on top of the source/drain regions. Conductive material(s) can then be deposited in the trenches followed by planarization to form source/drain contacts. The ILD material can be removed by any suitable etch process. For example, it can be removed by RIE containing $CHF_3/Ar$ plasma. ILD material above unused source or drain regions may remain on the structure. Contact material may, for example, include tantalum (Ta), aluminum (Al), platinum (Pt), gold (Au), tungsten (W), titanium (Ti), cobalt (Co) palladium (Pd) or any combination thereof. The contact material may be deposited by, for example, CVD, PECVD, PVD, plating, thermal or e-beam evaporation, or sputtering. The contact material may include a liner on trench sidewalls before filling the rest of the trench with an electrically conductive metal. Non-limiting liner materials include titanium nitride (TiN), tantalum nitride (TaN). A planarization process such as CMP is performed to remove any conductive material from the top surface of the structure 100. In some embodiments, insulator caps (not shown) can be formed on top of the source/drain contacts. The formation of the insulator caps on source/drain contacts is similar to the formation of the insulator cap on gate (e.g., recessing source/drain contacts, depositing and planarizing an insulator). The process described above allows greater overlap of the junctions extending from the source regions 50A with the gate stack and therefore a greater contact area between the source junctions and the gate stacks. Electrical resistance is relatively low. There is less overlap of the junctions on the drain sides with the metal gates. The relatively small contact area between the junctions associated with the drain regions and the bottom ends of the gate stacks results in relatively low parasitic capacitance.

By taking advantage of the self-aligned sidewall image transfer process to enable asymmetry, as described above, the fabrication process does not require precise overlay of a source/drain patterning mask on a small gate. The formation of an asymmetric field-effect transistor having a small gate length can be challenging. Patterning one side of the transistor and processing the other side can create overlay/misalignment issues that are substantially avoided using the techniques described herein.

FIGS. 10, 10A, 10B and 10C provide various views of an exemplary structure 100. FIG. 10 is a schematical, top plan view of the structure 100 showing the gate regions 58 extending across an array of parallel fins 32' formed from the substrate 32. It will be appreciated that the fins 32' may or may not have sidewalls that are entirely vertical. The bottoms of the fins 32' may in fact be larger in width than the top portions thereof. For example, if the substrate 32 in an exemplary embodiment is a (100) substrate, the side wall surfaces of the semiconductor fins described as (110) surfaces are at least close to being (110) surfaces but may or may not be exactly (110) surfaces. Fin width dimensions are accordingly average dimensions where fin width is not uniform.

Each asymmetric field-effect transistor device within the exemplary structure includes a semiconductor substrate 32, a doped epitaxial source region 50A on the semiconductor substrate 32, and a doped epitaxial drain region 50B on the semiconductor substrate. As schematically illustrated in FIG. 10B, the source region epitaxy, being formed in recesses having laterally extending portions, comprises embedded epitaxial structures that extend beneath the top surface of the STI layer 64. The drain region epitaxy is formed on the fin sidewalls (cladding epitaxy) in the illustrated embodiment and over the top ends of the fins, but does not extend below the top surface of the STI layer. The bottom portions of the fins 32' are embedded within the electrically insulating shallow trench isolation (STI) layer 64. The semiconductor channels 50C beneath the gate regions 58 are operatively associated with the doped epitaxial source region and the doped epitaxial drain region. Each gate electrode 58 includes a drain side and a source side. The source regions 50A extend beneath the source sides of the gate electrodes 58 in some embodiments. The widths of the top portions of the source regions 50A exceed the widths of the top portions of the drain regions 50B and therefore extend further towards the channel regions 50C than the drain regions 50B. A gate dielectric layer 56 is between each gate electrode and the channel region operatively associated therewith. In some embodiments, by having embedded epitaxy as the source and cladding epitaxy as the drain, epitaxy volume in the source is greater than that in drain because drain side still have the original undoped fin. By using the same thermal anneal, there will be more junction overlap on the source side than the drain side because of more dopant atoms in source side than the drain side.

Figure 7B:
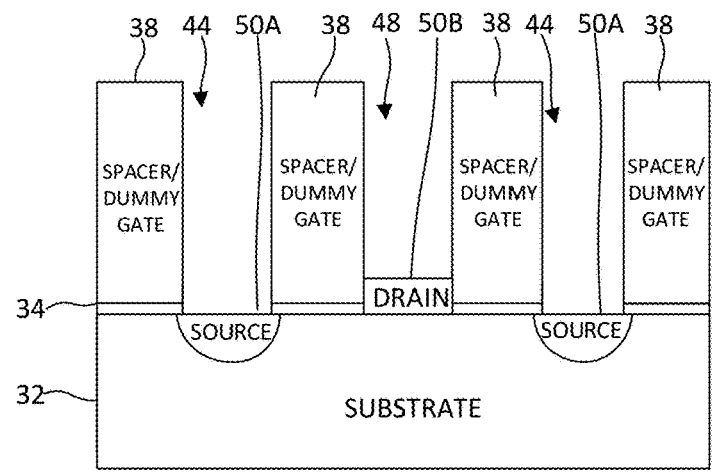
FIG. 7B is a schematic, cross-sectional view showing formation of source and drain regions during the fabrication of a planar, asymmetric field-effect transistor.

While the fabrication process and resulting devices have been described with respect to silicon-based transistors, it will be appreciated that materials other than those described herein, such as III-V compound semiconductor materials, can be employed in the formation of field-effect transistors having asymmetric source/drain regions. The techniques and concepts disclosed herein can be applied in the fabrication of various types of field-effect transistors, including planar transistors. By employing techniques substantially as described above to obtain a planar transistor, the drain will comprise raised epitaxy (epitaxy on top of the surface of the substrate on drain side), and the source will comprise embedded epitaxy. FIG. 7B schematically illustrates the formation of source and drain regions during the fabrication of a planar transistor. Such techniques and concepts are further applicable to non-planar transistors (e.g. FinFET, nanosheet transistors, and nanowire transistors) where it may be desirable to provide greater gate-to-source junction overlap and relatively less gate-to-drain junction overlap. In embodiments wherein FinFET devices are formed, the channels 50C are portions of monolithic semiconductor fins. For nanosheet or nanowire transistors, fins comprising the channels may include stacked nanosheets or nanowires. In some embodiments, n-type MOSFETs and p-type MOSFETs formed on the same substrate may have the same or different channel materials. For example, an n-type FinFET may include a channel comprising a portion of a silicon fin and a p-type FinFET may have a silicon germanium fin channel.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary asymmetric field-effect transistor device includes a semiconductor substrate 32 including a first region, a second region, and a channel region 50C between the first and second regions. The first region includes a recess 44' extending vertically therein while the second region lacks a recess. A gate electrode 58 is operatively associated with the channel region 50C of the substrate. A gate dielectric layer 56 is between the gate electrode and the channel region. A doped epitaxial source region 50A is on the first region of the semiconductor substrate and extends within the recess, as shown in FIGS. 10A and 10B. A doped epitaxial drain region 50B is on the second region of the semiconductor substrate. The semiconductor substrate 32 may include a semiconductor fin 32', the channel region and the recess being within the semiconductor fin and the drain region being on an unrecessed portion of the fin as schematically illustrated in FIGS. 10B and 10C. The source region 50A may extend beneath a portion of the gate dielectric layer 56, such as shown in FIG. 10A. The source region may further extend beneath a portion of the gate electrode 58.

A method of fabricating asymmetric field-effect transistor devices includes obtaining a structure including a semiconductor substrate having a plurality of parallel fins, the fins including first portions including recesses, second portions lacking recesses, and channel regions between the first and second portions. FIG. 6 schematically illustrates an exemplary structure. Embedded source regions are epitaxially grown within the recesses in the first portions of the fins and cladded drain regions are epitaxially grown on the second, unrecessed portions of the fins. A gate dielectric layer 56 is deposited over the channel regions of the fins and metal gates 58 are formed on the gate dielectric layer, as shown in FIG. 9. The fabrication method may further include forming a plurality of dummy gates 38 on the structure, the dummy gates extending perpendicularly with respect to the plurality of parallel fins 32'. The recesses 44' are formed in the first portions of the substrate between pairs of the plurality of dummy gates and include undercut portions extending beneath the dummy gates, as shown in FIG. 5. The dummy gates are ultimately replaced with the metal gates 58. The source regions and the drain regions are grown simultaneously in some embodiments using the same precursor gases. In some embodiments, the fabrication method further includes forming dielectric columns 54 between the dummy gates and extending vertically over the source and drain regions, such as shown in FIG. 8. The dummy gates are then removed to form trenches between the dielectric columns. Sidewall spacers 46 are formed on the sidewalls of the dielectric columns, possibly following trimming of the dielectric columns to reduce the widths thereof. One or more embodiments of the fabrication method include forming sacrificial mandrels 36 on the semiconductor substrate, the dummy gates being formed as spacers on sidewalls of the sacrificial mandrels using a sidewall image transfer process. A structure as shown in FIG. 2 may accordingly be obtained.

The sacrificial mandrels are removed from the dummy gates to form a plurality of first vertical trenches 44 as shown in FIG. 4. Dielectric columns 54 are formed within the plurality of first vertical trenches 44 subsequent to forming the source regions. The fabrication method may further include forming a second vertical trench 40 between a pair of the dummy gates 38 as shown in FIG. 2. The second vertical trench is filled with a filling material 42 having a different composition from the mandrels and dummy gates, which can accordingly be etched selectively with respect to each other. The filling material 42 is removed selectively with respect to the dummy gates to expose the second portions of the semiconductor substrate, as shown in FIG. 6. The second vertical trench is filled with one of the dielectric columns 54 subsequent to drain epitaxy.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having asymmetric transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating an asymmetric field-effect transistor device, comprising:
obtaining a structure including a semiconductor substrate, sacrificial mandrels on the semiconductor substrate, dummy gates on sidewalls of the sacrificial mandrels, and a vertical trench between a pair of the dummy gates;

filling the vertical trench with a filling material having a different composition from the mandrels and dummy gates;

selectively removing the mandrels to expose first portions of the semiconductor substrate;

subjecting the first portions of the semiconductor substrate to a first etching process, thereby forming first recesses within the first portions of the semiconductor substrate;

removing the filling material from the vertical trench to expose a second portion of the semiconductor substrate;

subjecting the first and second portions of the semiconductor substrate to a second etching process, thereby enlarging the first recesses within the first portions of the semiconductor substrate and forming a second recess in the second portion of the semiconductor substrate, the first recesses extending further vertically within the semiconductor substrate than the second recess following the second etching process;

epitaxially growing embedded source regions within the first recesses in the first portions of the semiconductor substrate;

epitaxially growing an embedded drain region within the second recess on the second portion of the semiconductor substrate;

removing the dummy gates, and replacing the dummy gates with a gate dielectric layer and metal gate material on the gate dielectric layer.

2. The method of claim 1, further including:

forming dielectric columns between the dummy gates and extending vertically over the source and drain regions;

forming trenches between the dielectric columns upon removing the dummy gates; and forming sidewall spacers on the dielectric columns.

3. The method of claim 2, further including reducing the widths of the dielectric columns prior to forming the sidewall spacers.

4. The method of claim 2, further including epitaxially growing the embedded source regions and drain regions simultaneously.

\* \* \* \* \*